(12) United States Patent
Lee et al.

(10) Patent No.: US 6,459,652 B1
(45) Date of Patent: Oct. 1, 2002

(54) SEMICONDUCTOR MEMORY DEVICE HAVING ECHO CLOCK PATH

(75) Inventors: Jong Cheol Lee; Kwang Jin Lee, both of Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/996,225

(22) Filed: Nov. 28, 2001

(30) Foreign Application Priority Data

Jul. 4, 2001 (KR) .......................................... 01-39700

(51) Int. Cl.⁷ .................................................. G11C 8/00

(52) U.S. Cl. ...................................... 365/233; 365/194

(58) Field of Search ................................ 365/233, 194, 365/239

(56) References Cited

U.S. PATENT DOCUMENTS 6,278,637 B1 * 8/2001 Kawaguchi .............. 365/89.05

* cited by examiner

*Primary Examiner*—Vu A. Le
(74) *Attorney, Agent, or Firm*—F. Chau & Associates, LLP

(57) ABSTRACT

A semiconductor memory device effectively capable of removing skew between data output of a data output circuit and an echo clock of an echo clock generator is provided. The semiconductor memory device comprises a delay circuit comprising a plurality of delay paths for delaying the data enable clock by different time, a test controller for generating a mode select signal and a delay path test signal in response to a test code signal, and a delay signal selection circuit comprising a plurality of fuses for producing a default delay path select signal based on a programmed state of the plurality of fuses, and a multiplexer, responsive to the mode select signal, for selectively providing the default delay path select signal or the delay path test signal to the delay circuit.

15 Claims, 5 Drawing Sheets

SEMICONDUCTOR MEMORY DEVICE HAVING ECHO CLOCK PATH

BACKGROUND

1. Technical Field

The present invention relates to a semiconductor memory device having an echo clock path, and more particularly, to a semiconductor memory device capable of preventing skew between output data and an echo clock by controlling the generation of the echo clock.

2. Description of Related Art

When a synchronous pipe line type semiconductor memory device receives/outputs data from/to an external central processing unit (CPU), it will output an echo clock as a reference signal. A device such as an external CPU, fetching data from a semiconductor memory device, senses output time of data from the semiconductor memory device depending on power source, temperature, etc., through such an echo clock. Thus, the device can fetch and use correct data irrespective of environmental changes.

Most memory devices output an echo clock only at a read operation mode. However, double data rate SRAMs (DDR SRAMs), for example, output an echo clock both at a read operation mode and at a write operation mode. This is a free running echo clock mode. The mode uses the main data lines (MDL) for an echo clock connected to a power source voltage (VDD) or a ground voltage (GND) (as opposed to sensing the main data lines (MDL) for output data developed just after data are output through a sense amplifier), because the main data line (MDL) is potential-developed only at a read operation.

However, the free running echo clock mode has a disadvantage in that skew between the output data and the echo clock increases at a limit region of an operation cycle of a semiconductor memory device. To solve the problem, conventional semiconductor devices have employed a fuse for delaying an output clock generated from a data output clock driver to decrease the skew between a clock out (CQ) and a data out (DQ).

FIG. 1 is a block diagram of a conventional semiconductor memory device having an echo clock path. The semiconductor memory device comprises a cell data output part 10 for sensing and amplifying data in a memory cell array 20, synchronizing the amplified data with a data enable clock KDATA and outputting the synchronized data to an external input/output pad (not shown); an echo clock generator 12 synchronized with the data enable clock signal KDATA and receiving a power source voltage VDD and a ground voltage GND and generating an echo clock; an output data clock driver 14 synchronized with a rising edge and a falling edge provided from an external signal and generating the data enable clock KDATA; a variable delayer 16 having a plurality of delay paths, each delay path delaying the data enable clock KDATA differently and selecting a delay path in response to a delay path select signal to supply the delayed data enable clock KDATA to the cell data output part 10 and the echo clock generator 12; and a fuse array 18 having a plurality of fuses and providing the delay path select signal to the variable delayer 16.

The cell data output part 10 comprises a memory cell array 20 having a plurality of memory cells; main data lines MDL_T (Main Data Line_True) and MDL_C (Main Data Line_Complement) for receiving sensed and amplified data from the memory cell array 20; a data latch 22 for latching signals loaded on the main data line (MDL_T and MDL_C); a data output buffer 24 buffering an output data of the data latch 22 in response to the data enable clock KDATA; and an off-chip driver 26 for outputting the buffered data to an external input/output pad (not shown).

The echo clock generator 12 comprises an echo clock latch 28, connected to the power source voltage VDD and the ground voltage GND, for latching the voltages as echo data; a data output buffer 30 for buffering an output data of the data latch 28 in response to the data enable clock KDATA; and an off-chip driver 32 for outputting the buffered echo data to an external input/output pad (not shown).

Referring FIG. 1, when data is sensed and amplified in the memory cell array 20, the data is loaded on the main data line (MDL_T and MDL_C). The data latch 22 latches the loaded data and supplies the latched data to the data output buffer 24. At this time, the echo clock latch 28 latches the power source voltage VDD and the ground voltage GND and supplies the latched voltages to the data output buffer 30.

The output data clock driver 14 produces the data enable clock KDATA in response to a rising edge and a falling edge of an external signal and supplies the data enable clock KDATA to the variable delayer 16. The variable delayer 16 provides a plurality of delay paths, each having a path delayer. The output of each path delayer is selectively supplied to the data output buffers 24, 30 in the data output part 10 and the echo clock generator 12 by a delay select signal output from the fuse array 18, respectively. For example, the variable delayer 16 may have a plurality of inverters serially connected to each other.

The fuse array 18 has at least two or more fuses connected between the power source voltage VDD and the ground voltage GND, and generates the delay select signal corresponding to selective cutting of the fuses, to provide the delay select signal to the variable delayer 16. The fuses are selectively cut in response to operational frequencies of the memory device. Accordingly, the delayed data enable clock KDATA is input to the data buffers 24, 30 in response to the operation cycle. The data output buffers 24, 30 output data and the echo clock from the memory cell array 10 and the echo clock latch 28 to the off-chip drivers 26, 32 in response to the delayed data enable clock KDATA, respectively. The off-chip drivers 26, 32 output the data and echo clock through an external data input/output pad and an external echo clock pad, respectively.

In the conventional device shown in FIG. 1, the skew between the Data Out and the Echo Clock is reduced by delaying an output clock for a predetermined time in a operation cycle. But, there is a problem that the frequency range of the DDR SRAM is limited because the delay time of output clock cannot be controlled after the SRAM is packaged.

FIG. 2 shows a block diagram of a semiconductor memory device having a dummy SRAM cell. The dummy SRAM cell compares a clock signal with output data, and reduces the delay of the output clock in a long cycle time. A cell data output part 10 comprises a dummy cell array 34 in addition to a memory cell array 20. The dummy cell array 34 senses and amplifies data of dummy cell to output the amplified data to dummy main data lines DMDL_T (Dummy Main Data Line_True) and DMDL_C (Dummy Main Data Line_Complement). A data to clock comparator 36 receives the data on the dummy main data lines (DMDL_T and DMDL_C), and compares the data with a data enable clock KDATA. A register 38 receives a comparison data from the data to clock comparator 36 and selects a delay select signal corresponding to the comparison data to output the delay select signal to a variable delayer 16. The variable delayer 16 selects a delay path corresponding to the delay select signal and provides the delayed data enable clock KDATA to the data output buffers 24, 30 in the cell data output part 10 and the echo clock generator 12, respectively.

This conventional device has a disadvantage in that additional hardware is required because of repeating the path from the dummy cell array to an output latch, while controlling clock delay irrespective of a cycle time.

SUMMARY OF THE INVENTION

To solve the problems as described above, it is an object of the present invention to provide a semiconductor memory device effectively capable of removing skew between data output from a memory cell and an echo clock output from an echo clock generator.

It is another object of the present invention to provide a semiconductor memory device capable of selecting an optimal delay time in an operation cycle time even after packaging.

According to an aspect of the present invention, a semiconductor memory device comprises a data output circuit for sensing and amplifying data in a memory cell array and for synchronizing the amplified data with a data enable clock signal to output the data; an echo clock generator synchronized with the data enable clock signal and receiving a power source voltage and a ground voltage to generate an echo clock; a delay circuit comprising a plurality of delay paths, wherein each delay path delays the data enable clock by different time, and wherein the delay circuit selects a delay path of the plurality of delay paths in response to a delay path select signal to supply the delayed data enable clock to the data output circuit and the echo clock generator; a test controller for generating a mode select signal and a delay path test signal in response to a test code signal; and a delay signal selection circuit comprising a plurality of fuses for producing a default delay path select signal based on a programmed state of the plurality of fuses, and a multiplexer, responsive to the mode select signal, for selectively providing the default delay path select signal or the delay path test signal to the delay circuit.

The device may further comprise an output data clock drivers synchronized with a rising edge and a falling edge of an external signal to generate the data enable clock.

In one embodiment of the present invention, the delay circuit comprises a plurality of delay devices serially connected to input node of the data enable clock and a plurality of switches, in which at least one switch is connected to the input node of the data enable clock or the output of a delay device. The switches are selectively activated in response to the delay path select signal to output a non-delayed data enable clock signal or delayed data enable clock signal.

In one embodiment of the present invention, the delay signal selection circuit further comprises a first transistor, connected between the plurality of fuses and the ground voltage, for reading the programmed state of the fuses in response to a control signal, and a latch, connected between the plurality of fuses and the first transistor, for latching the default delay path select signal output from the plurality of fuses. The multiplexer receives the default delay path select signal from the latch and receives the delay path test signal and the mode select signal from the test controller. And, the multiplexer selects the delay path test signal as the delay path select signal when the mode select signal is active, and selects the default delay path select signal as the delay path select signal when the mode select signal is inactive.

According to another aspect of the present invention, a method is provided for preventing skew between output data and echo clock in a semiconductor memory device. The method comprises the steps of: generating a data enable clock signal; and delaying the data enable clock signal by an amount of delay time that reduces skew between an output data signal and an echo data signal, wherein the step of delaying comprises selecting between one of a default control signal to delay the data enable signal by a predetermined amount and a test control signal to dynamically modify an amount of delay of the data enable signal during a test mode.

According to further aspect of the present invention, a semiconductor device comprises means for generating a data enable clock signal; means for generating a default control signal to delay the data enable signal by a predetermined amount; means for selecting one of the default control signal and a test control signal to dynamically modify an amount of delay of the data enable signal during a test mode; and means for delaying the data enable clock signal by an amount of delay time that reduces skew between an output data signal and an echo data signal in response to the selected signal.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS

Figure 1:
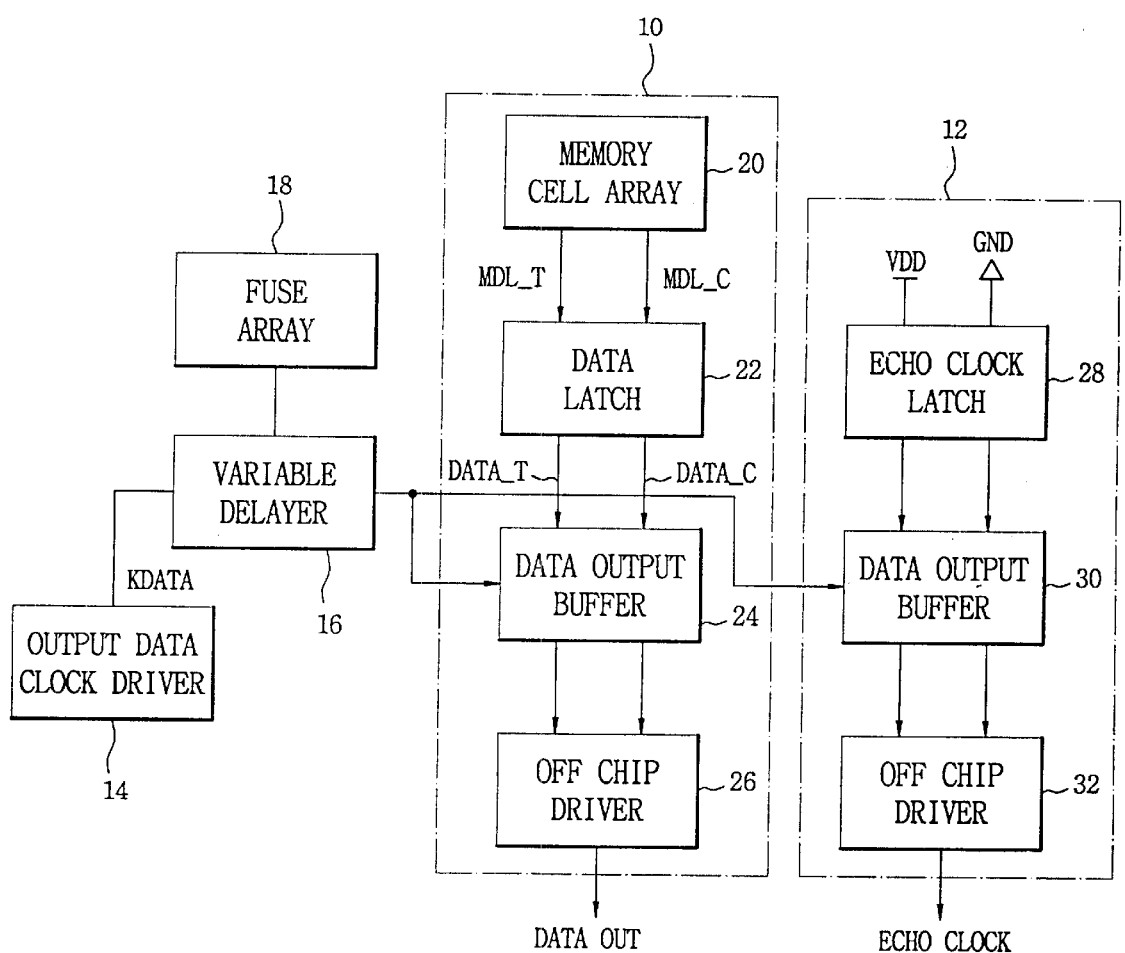
FIG. 1 is a block diagram of a conventional semiconductor memory device having an echo clock path.
Figure 2:
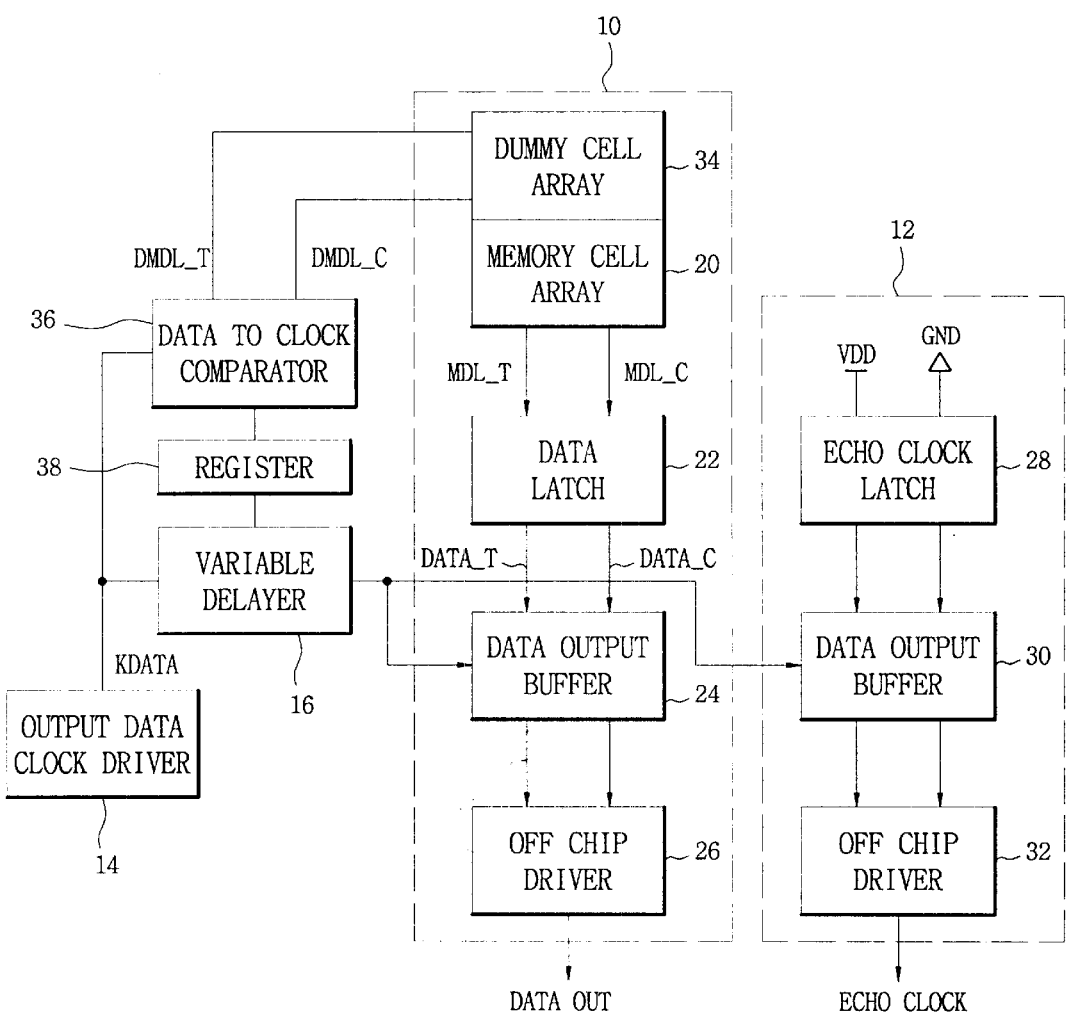
FIG. 2 is a block diagram of another conventional semiconductor memory device having an echo clock path.

In the following description, the same reference numerals are used to denote similar or equivalent parts or portions. In addition, specifications will be made to provide a thorough understanding of the present invention, although it is readily apparent to one skilled in the art that the present invention can be achieved without the specifications. A detailed description of well-known functions and structures will be omitted so as to clarify key points of the present invention.

Figure 3:
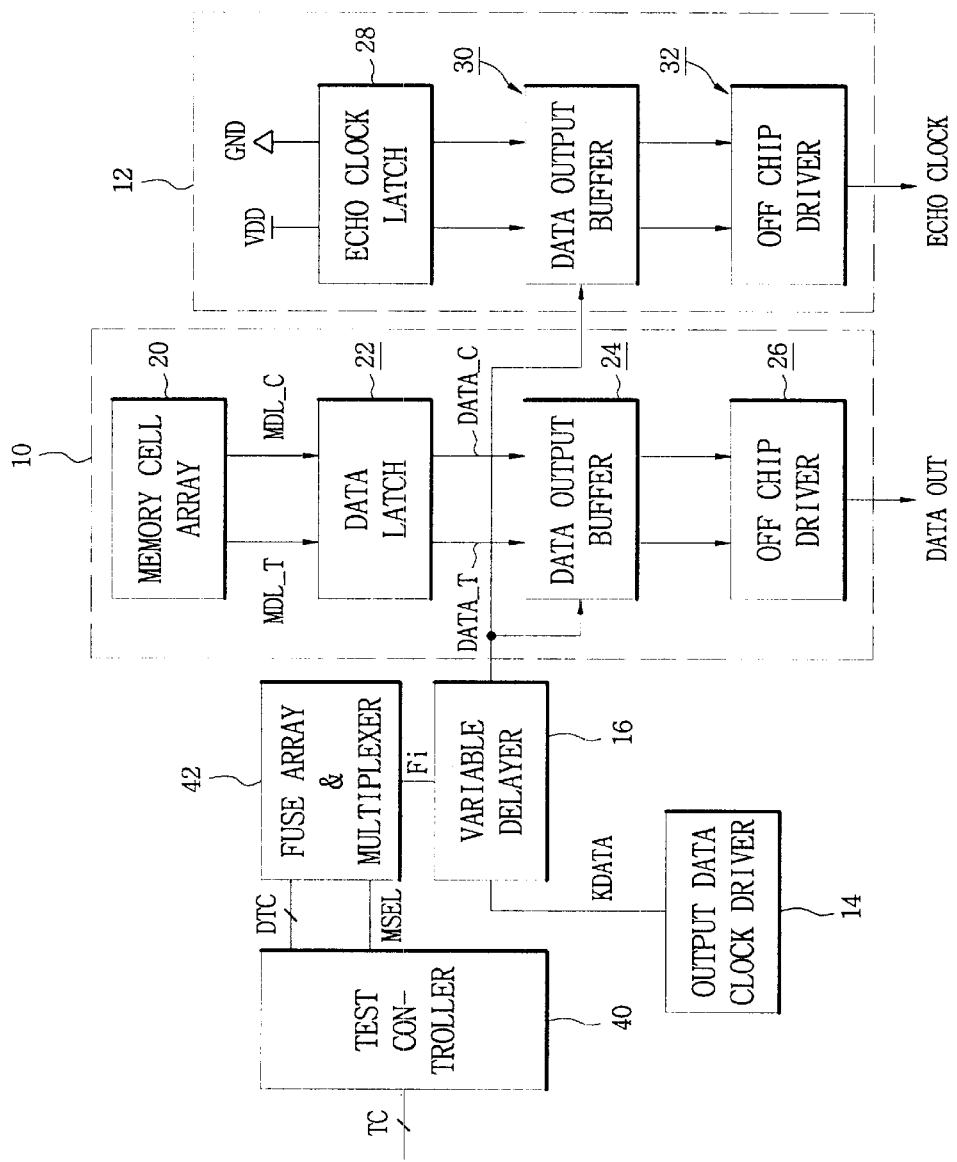
FIG. 3 is a block diagram of a semiconductor memory device comprising an echo clock path according to an embodiment of the present invention.

FIG. 3 is a block diagram of a semiconductor memory device comprising an echo clock path according to an embodiment of the present invention.

In addition to components of the conventional devices described above, a semiconductor memory device of the present invention further comprises a test controller 40 for outputting a delay path test code DTC to select a delay path corresponding to an external test code TC and for generating a mode select signal MSEL. The device of FIG. 3 further comprises a delay signal selection circuit 42 comprising at least two or more fuses for selecting one of the delay paths in a variable delayer 16 and selectively providing the delay path test code DTC and a delay path select signal Fi to the variable delayer 16 according to the mode select signal MSEL.

Figure 4:
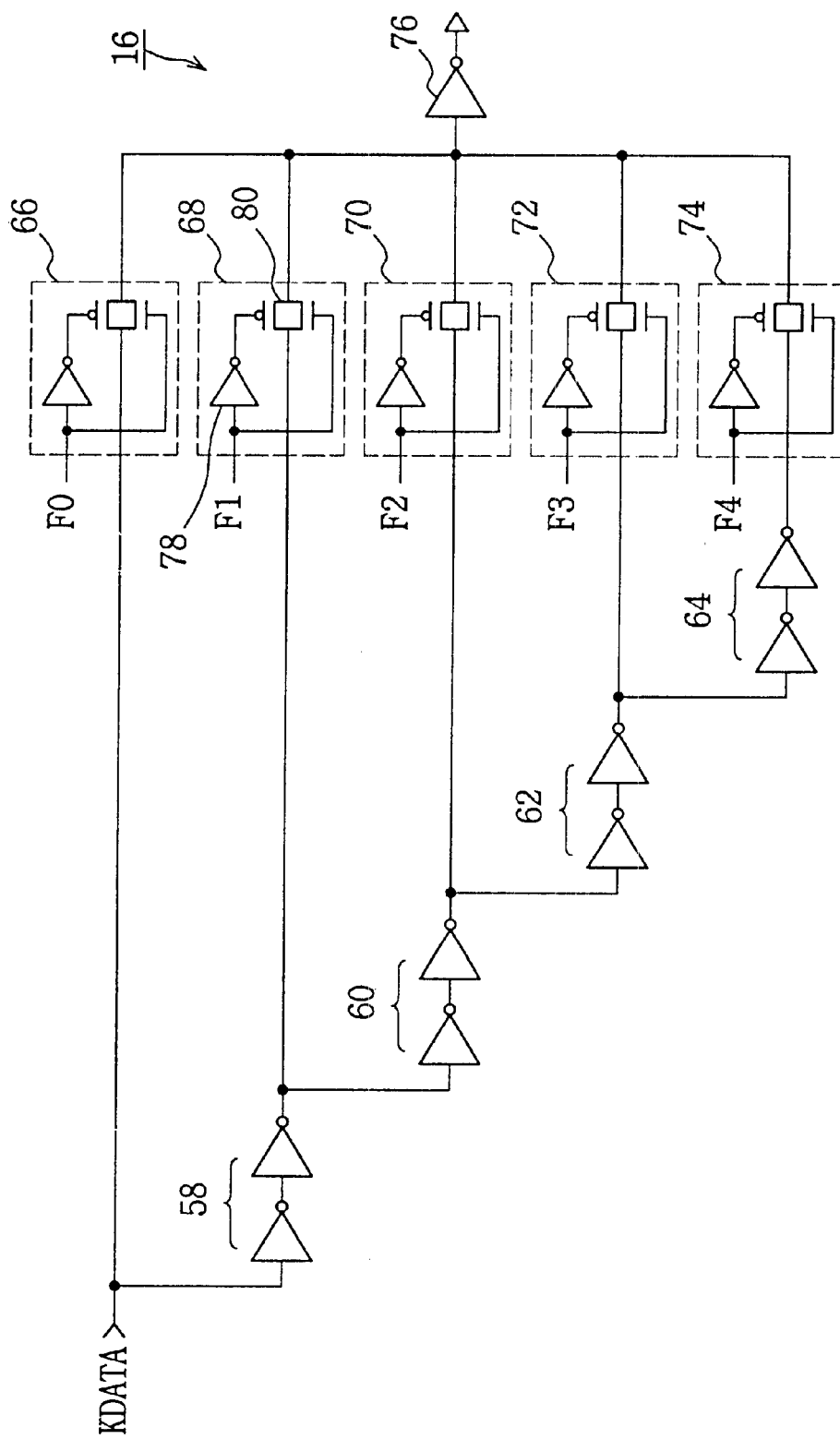
FIG. 4 is a circuit diagram of a variable delayer circuit according to an embodiment of the present invention.

FIG. 4 is a circuit diagram of the variable delayer 16 in FIG. 3 according to an embodiment of the present invention. Referring to FIG. 4, the variable delayer 16 comprises inverter chains 58–64 serially connected to input nodes of the data enable clock KDATA, switches 66–74 connected between the input nodes of the data enable clock KDATA and the output nodes of the inverter chains 58–64, clock output nodes, and a output driving inverter 76 connected to the clock output nodes.

Each inverter chain 58–64 comprises a pair of inverters serially connected to each other to delay the data enable clock KDATA. Each switch 66–74 comprises an inverter and a transfer gate, and is switched in response to inputs of the delay path select signals Fi (i=1, 2, 3, 4, . . . , n) that are exclusively activated with each other. The outputs of the switches 66–74 are commonly connected to the clock output node, and the signal of the clock output node is inverted by the output driving inverter 76 and provided to the data output buffers 24, 30 in the cell data output part 10 and the echo clock generator 12, respectively. Preferably, each inverter chain 58–64 produces the same delay time.

When the variable delay 16 receives the data enable clock KDATA synchronized with the rising edge and falling edge of an external clock, the data enable clock KDATA is first inputted to the switch 66 without delay. And, the data enable clock KDATA is delayed by a predetermined delay time by the inverter chains 58–64 and inputted to the switches 68–74 through several delay paths. At this time, the switches 66–74 are selectively driven in response to the delay path select signals Fi to connect the delay paths and the output driving inverter 76. For instance, with the switch 68, when the delay path select signal F1 is "high", the output of an inverter 78 is "low" and a transfer gate 80 is on. As a result, the data enable clock KDATA (which is delayed by a predetermined time by the inverter chain 58) is transferred to the data output buffers 24, 30 in the cell data output part 10 and the echo clock generator 12 through the inverter 76, respectively. That is, the variable delayer 16 outputs the data enable clock signals KDATA with different delay time through the plurality of delay paths in response to the delay path select signal Fi.

It is to be understood that although the variable delayer 15 is shown as having five delay paths in FIG. 4, the variable delayer 15 may comprise any number of delay paths by adding/removing an inverter chain and a switch.

Figure 5:
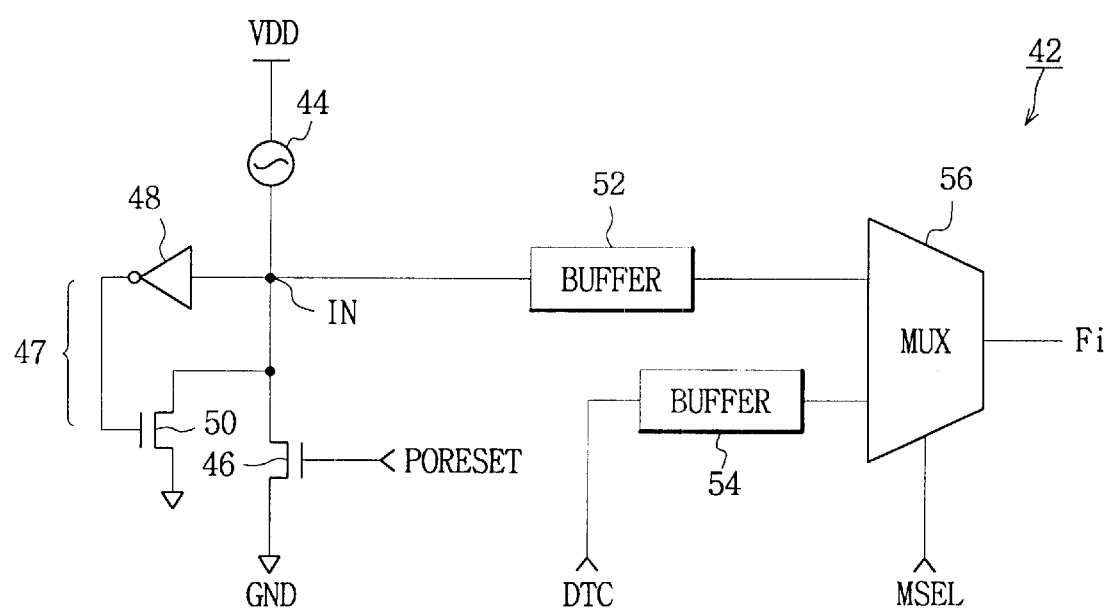
FIG. 5 is a circuit diagram of a delay signal selection circuit according to an embodiment of the present invention.

FIG. 5 is a circuit diagram of a delay signal selection circuit according to an embodiment of the invention, which is preferably implemented in the device of FIG. 3. Referring to FIG. 5, a delay signal selection circuit 42 comprises a fuse array comprising a fuse 44, a latch 47 (which comprises NMOS transistors 46, 50 and an inverter 48), buffers 52, 54, and a multiplexer 56. The fuse 44 is operatively connected between power source voltage VDD and an internal node IN, and is programmed to be cut/uncut. The NMOS transistor 46 is connected between the internal node IN and a ground GND and reads the programming state of the fuse 44 in response to a power on reset PORESET signal at its gate. The NMOS transistor 50 and the inverter 48 form a latch 47 for latching an output of the internal node IN. The buffer 52 buffers a logic of the latched internal node IN, and the buffer 54 buffers the delay path test code DTC output from the test controller 40. The multiplexer 56 receives outputs of the buffers 52, 54 and selects the delay path test code or the delay path select signal in response to the mode select signal MSEL to output the delay path select signal Fi.

The delay signal selection circuit 42 as shown in FIG. 5 is preferably constructed based on the number of the switches shown in FIG. 4. If necessary, only the fuse array may be extended without the buffers 52, 54 and the multiplexer 56. For instance, if the number of the switches shown in FIG. 4 is five and the ratio of input to output of the multiplexer 56 is 10:5, the delay signal selection circuit 42 may be formed by only extending the fuse array with a fuse 44, NMOS transistors 46, 50, an inverter 48. In this case, the buffers 52, 54 should buffer bits.

The delay signal selection circuit 42 performs fuse programming. When the fuse 44 is cut and the NMOS transistor 46 receives a power on reset signal PORESET of logic high for a predetermined time, the NMOS transistor 46 is on and the internal node IN become logic low. Thus, the signal PORESET is latched by the latch 47 and inputted to the buffer 52. In contrast, when the fuse 44 is not cut off, although the transistor 46 receives the power on reset signal PRESET, the internal node IN of logic high is latched and inputted to the buffer 52. Accordingly, a default state of the delay path select signal is programmed by cutting/non-cutting off the fuses 44.

When the mode select signal MSEL is inactive, the delay path select signal in a default state is always selected by the multiplexer 56 to control the data enable clock KDATA and a generation of an echo clock.

However, when the mode select signal MSEL is active, i.e., in a test mode, the delay test code DTC from the buffer 54 is inputted to the variable delayer 16 to control a clock delay. The present invention differs from conventional devices in that the invention minimizes the output time of data at various operational frequency bands by using the test mode prevents skew between data and echo clock.

Referring to FIGS. 3–5, when a test code TC is input to the test controller 40 to detect optimal delay in a given cycle time of a semiconductor memory device, the test controller 40 provides the mode select signal MSEL and the delay test code DTC to the delay signal selection circuit 42 in response to the test code TC. The delay test code DTC is input to the buffer 54, and the mode select signal MSEL is input to the multiplexer 56.

At this time, the fuses 44 in the delay signal selection circuit 42 are programmed by selectively cutting the fuses. The programming information is stored in the latch 47 and provided to the buffer 52 as the delay path select signal of default state. The multiplexer 56 selects one of two codes, i.e., the delay test code DTC or the delay path select signal of default state, in response to the mode select signal MSEL, and then provides a selected code to the switches 66–74 in the variable delayer 16.

At the test mode, the mode select signal MSEL is high, and the multiplexer 56 selects the delay test code DTC to provide it to the variable delayer 16. At this time, if the delay test codes DTC is output from the test controller 40 sequentially, an optimal clock delay path in an operation cycle can be selected. For instance, if the delay test signal DTC is output from the test controller 40 so that the plurality of delay paths can be sequentially selected, the optimal clock delay can be selected through the variable delayer 16. If the properly delayed data enable clock KDATA is output from the variable delayer 16, the skew between data output and echo clock of the data output buffers 24, 30 can be prevented. Thus, the fuse array may be programmed to select an optimal delay path in the given operation cycle time.

Advantageously, according to a preferred embodiment of the present invention, a user can program a delay path select signal of default state (that is set by cutting fuses) into a semiconductor memory device prior to packaging the device to reduce skew between data and echo clock in a given cycle time of the device. In addition, when a user operates the SRAM with a different cycle time, he or she can select an optimal delay time of output clock through a test mode even after the device is packaged.

While the invention has been described in terms of preferred embodiments, those skilled in the art will recognize that the invention can be practiced with modification within the sprit and scope of the appended claims.

What is claimed is:

1. A semiconductor memory device, comprising:

a data output circuit for sensing and amplifying data in a memory cell array and for synchronizing the amplified data with a data enable clock signal to output the data;

an echo clock generator synchronized with the data enable clock signal and receiving a power source voltage and a ground voltage to generate an echo clock;

a delay circuit comprising a plurality of delay paths, wherein each delay path delays the data enable clock by different time, and wherein the delay circuit selects a delay path of the plurality of delay paths in response to a delay path select signal to supply the delayed data enable clock to the data output circuit and the echo clock generator;

a test controller for generating a mode select signal and a delay path test signal in response to a test code signal; and a delay signal selection circuit comprising a plurality of fuses for producing a default delay path select signal based on a programmed state of the plurality of fuses, and a multiplexer, responsive to the mode select signal, for selectively providing the default delay path select signal or the delay path test signal to the delay circuit as the delay path select signal.

2. The device as claimed in claim 1, further comprising an output data clock driver synchronized with a rising edge and a falling edge of an external signal to generate the data enable clock.

3. The device as claimed in claim 1, wherein the delay circuit comprises:

a plurality of delay devices serially connected to an input node of the data enable clock; and a plurality of switches, wherein at least one switch is connected to the input node of the data enable clock and wherein at least one switch is connected to the output of a delay device, wherein the switches are selectively activated in response to the delay path select signal to output a non-delayed data enable clock signal or delayed data enable clock signal.

4. The device as claimed in claim 3, wherein the delay circuit further comprises an output driving inverter, connected to output terminals of each switch, to invert the output of each switch.

5. The device as claimed in claim 3, wherein each delay device delays the data enable clock signal by a similar amount.

6. The device as claimed in claim 1, wherein the delay signal selection circuit further comprises:

a first transistor, connected between the plurality of fuses and the ground voltage, for reading the programmed state of the fuses in response to a control signal; and a latch, connected between the plurality of fuses and the first transistor, for latching the default delay path select signal output from the plurality of fuses, wherein the multiplexer receives the default delay path select signal from the latch and receives the delay path test signal and the mode select signal from the test controller, and wherein the multiplexer selects the delay path test signal as the delay path select signal when the mode select signal is active, and selects the default delay path select signal as the delay path select signal when the mode select signal is inactive.

7. The device as claimed in claim 6, wherein the delay signal selection circuit further comprises:

a first buffer for buffering the delay path select signal output from the latch; and a second buffer for buffering the delay path test signal output from the test controller.

8. The device as claimed in claim 6, wherein the latch comprises an inverter for inverting outputs of the plurality of fuses and a second transistor for latching the output of the inverter.

9. The device as claimed in claim 6, wherein the control signal comprises a power on reset signal.

10. The device as claimed in claim 1, wherein the data output circuit comprises:

a data latch for latching the amplified data in the memory cell array;

a first data output buffer for buffering the latched data and outputting the buffered data in response to the data enable clock signal; and a first off chip driver for outputting the data from the data output buffer.

11. The device as claimed in claim 1, wherein the echo clock generator comprises:

a echo clock latch for latching the power source voltage and the ground voltage;

a second data output buffer for buffering the latched voltage and outputting the echo clock in response to the data enable clock signal; and a second off chip driver for outputting the echo clock from the second data output buffer.

12. A method for preventing skew between output data and echo clock in a semiconductor memory device, comprising the steps of:

generating a data enable clock signal; and delaying the data enable clock signal by an amount of delay time that reduces skew between an output data signal and an echo data signal, wherein the step of delaying comprises selecting between one of a default control signal to delay the data enable signal by a predetermined amount and a test control signal to dynamically modify an amount of delay of the data enable signal during a test mode.

13. The method as claimed in claim 12, wherein the step of delaying further comprising the step of changing the amount of delay time of the data enable clock signal in response to the selected signal.

14. A semiconductor device, comprising:

means for generating a data enable clock signal; and means for generating a default control signal to delay the data enable signal by a predetermined amount;

means for selecting one of the default control signal and a test control signal to dynamically modify an amount of delay of the data enable signal during a test mode; and means for delaying the data enable clock signal by an amount of delay time that reduces skew between an output data signal and an echo data signal in response to the selected signal.

15. The device as claimed in claim 14, further comprising means for generating a test mode select signal to select the test control signal in response to an external test signal.

* * * * *